United States Patent
Iyengar

(10) Patent No.: US 9,520,194 B2
(45) Date of Patent: *Dec. 13, 2016

(54) PRE-COMPUTATION BASED TERNARY CONTENT ADDRESSABLE MEMORY

(71) Applicant: Broadcom Corporation, Irvine, CA (US)

(72) Inventor: Vinay Iyengar, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/700,715

(22) Filed: Apr. 30, 2015

(65) Prior Publication Data

US 2015/0235701 A1   Aug. 20, 2015

Related U.S. Application Data

(63) Continuation of application No. 13/628,485, filed on Sep. 27, 2012, now Pat. No. 9,070,435.

(51) Int. Cl.
*G11C 15/00* (2006.01)
*G11C 15/04* (2006.01)

(52) U.S. Cl.
CPC ............. *G11C 15/00* (2013.01); *G11C 15/04* (2013.01)

(58) Field of Classification Search
CPC ............ G11C 11/1673; G11C 11/1675; G11C 11/4094; G11C 11/4096; G11C 14/0036; G11C 7/1072
See application file for complete search history.

(56) References Cited

U.S. PATENT DOCUMENTS

| | | | |
|---|---|---|---|
| 7,050,318 B1 * | 5/2006 | Argyres | G11C 7/12 365/189.07 |
| 7,711,893 B1 | 5/2010 | Venkatachary | |
| 2005/0135135 A1 | 6/2005 | Sharma et al. | |
| 2005/0157526 A1 | 7/2005 | Hanzawa et al. | |
| 2007/0028039 A1 | 2/2007 | Gupta et al. | |
| 2010/0214811 A1 | 8/2010 | Franceschini et al. | |
| 2014/0085958 A1 | 3/2014 | Iyengar | |

OTHER PUBLICATIONS

Lin et al., "A Low-Power Precomputation-Based Fully Parallel Content-Addressable Memory," IEEE J. Solid-State Circuits, vol. 38, No. 4, pp. 654-662, Apr. 2003.*

(Continued)

*Primary Examiner* — Son Dinh
*Assistant Examiner* — Uyen B Tran
(74) *Attorney, Agent, or Firm* — Sterne, Kessler, Goldstein & Fox P.L.L.C.

(57) ABSTRACT

A pre-computation based TCAM configured to reduce the number of match lines being pre-charged during a search operation to save power is disclosed. The pre-computation based TCAM stores additional information in a secondary TCAM that can be used to determine which match lines in a primary TCAM storing data words to be searched need not be pre-charged because they are associated with data words guaranteed to not match. The additional information stored in secondary TCAM can include a pre-computation word that represents a range inclusive of a lower and upper bound of a number of ones or zeroes possible in a corresponding data word stored in the primary TCAM.

20 Claims, 6 Drawing Sheets

(56) References Cited

OTHER PUBLICATIONS

Pagiamtzis, K., and Sheikholeslami, A., "Content-Addressable Memory (CAM) Circuits and Architectures: A Tutorial and Survey," *IEEE J. Solid State Circuits*, vol. 41, No. 3, pp. 712-727, Mar. 2006.

Srinivasan et al., "Packet Classification using Tuple Space Search," *ACM SIGCOMM Computer Communication Review*, Oct. 1999, vol. 29 Issue 4, ACM, New York.

Gupta, P., and McKeown, N., "Packet Classification on Multiple Fields," Computer Systems Laboratory, 1999, Stanford University, Stanford, CA.

Baboescu, F., and Varghese, G., "Scalable Packet Classification," *ACM SIGCOMM Computer Communication Review*, Aug. 2001, 199-210, ACM, San Diego.

* cited by examiner

PRE-COMPUTATION BASED TERNARY CONTENT ADDRESSABLE MEMORY

CROSS REFERENCE TO RELATED APPLICATIONS

This application is a continuation of U.S. patent application Ser. No. 13/628,485, filed on Sep. 27, 2012, which is incorporated herein by reference in its entirety.

FIELD OF THE INVENTION

This application relates generally to content addressable memory (CAM) devices and, more specifically, to ternary content addressable memory (TCAM) devices.

BACKGROUND

In many memory devices, including random access memory (RAM) devices, data is typically accessed by supplying an address to an array of memory cells and then reading data from the memory cells that reside at the supplied address. However, in content addressable memory (CAM) devices, data within an array of memory cells is generally not accessed by supplying an address, but rather by initially applying data (e.g., a search word) to the array and then performing a search operation to identify the location of one or more entries within the array that contain data equivalent to the applied data. In this manner, data is accessed according to its content rather than its address. Upon completion of the search operation, the identified location containing the equivalent data is typically encoded to provide an address at which the matching entry is located. If multiple locations with matching entries are identified in response to the search operation, then priority encoding operations can be performed to identify an address of a best or highest priority matching entry.

A ternary content addressable memory (TCAM) device is a specific type of CAM device for performing the above noted functionality. A TCAM device includes an array of ternary memory cells. As opposed to typical memory cells that store only one bit of digital information, each ternary memory cell stores two bits of digital information that represent either logic zero, logic one, or logic don't care (i.e., a wildcard value that can represent either logic zero or logic one). The bits stored within a row of ternary memory cells in a TCAM device often constitute a data word. During search operations, a search word is applied to appropriate input terminals of the TCAM and then compared with the data words stored in each row of the array of ternary memory cells. For each stored data word that matches the search word, an associated match line signal is asserted to indicate a match condition.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

1. OVERVIEW

Figure 1:
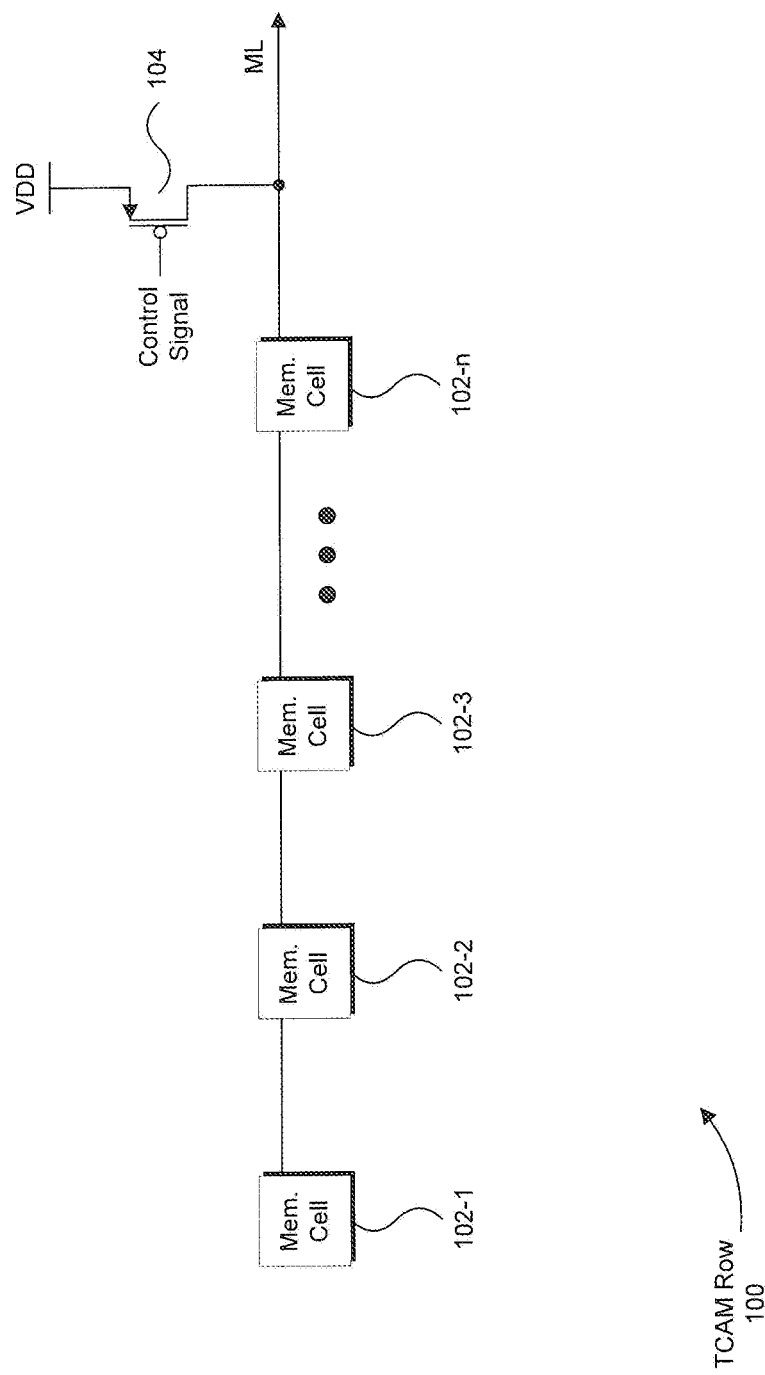
FIG. 1 illustrates a typical TCAM row of ternary memory cells in accordance with embodiments of the present disclosure.

FIG. 1 illustrates a typical TCAM row 100 that includes n ternary memory cells 102-1 through 102-n each coupled to the same associated match line ML. A pull-up transistor 104, coupled between a supply voltage VDD and the match line ML, has its gate terminal tied to a control signal that turns pull-up transistor 104 on to pre-charge the match line ML prior to each search operation between a search word and a data word stored in ternary memory cells 102-1 through 102-n. During a search operation, each ternary memory cell 102-1 through 102-n specifically compares its stored logic value (i.e., logic zero, logic one, or logic don't care) to a corresponding different one of the logic values in the search word. If all of the logic values of the search word match their corresponding logic values stored in ternary memory cells 102-1 through 102-n, the match line ML remains charged to indicate a match condition. Conversely, if one of the logic values of the search word does not match its corresponding logic value stored in one of ternary memory cells 102-1 through 102-*n*, the ternary memory cell storing that logic value discharges the match line ML toward ground potential to indicate a mismatch condition.

In general, each data word in a TCAM device has its own associated match line ML, similar to match line ML in FIG. 1, and these match lines are typically pre-charged by a pull-up transistor before each and every compare operation. Thus, for each mismatch condition in a TCAM device, an associated match line pre-charged toward a supply voltage VDD is discharged toward ground potential. Current flow associated with this charging and discharging of the match lines in a TCAM device results in a large amount of power consumption.

Embodiments of the present disclosure are directed to a pre-computation based TCAM configured to reduce the number of match lines being pre-charged during a search operation to save power. Before describing these embodiments, a TCAM architecture is first described below in Section 2. It will be appreciated by one of ordinary skill in the art that the TCAM architecture described below in Section 2 represents only one exemplary architecture and that embodiments of the present disclosure are equally applicable to other TCAM architectures having other configurations and employing any suitable ternary memory cell.

2. TCAM ARCHITECTURE

Figure 2A:
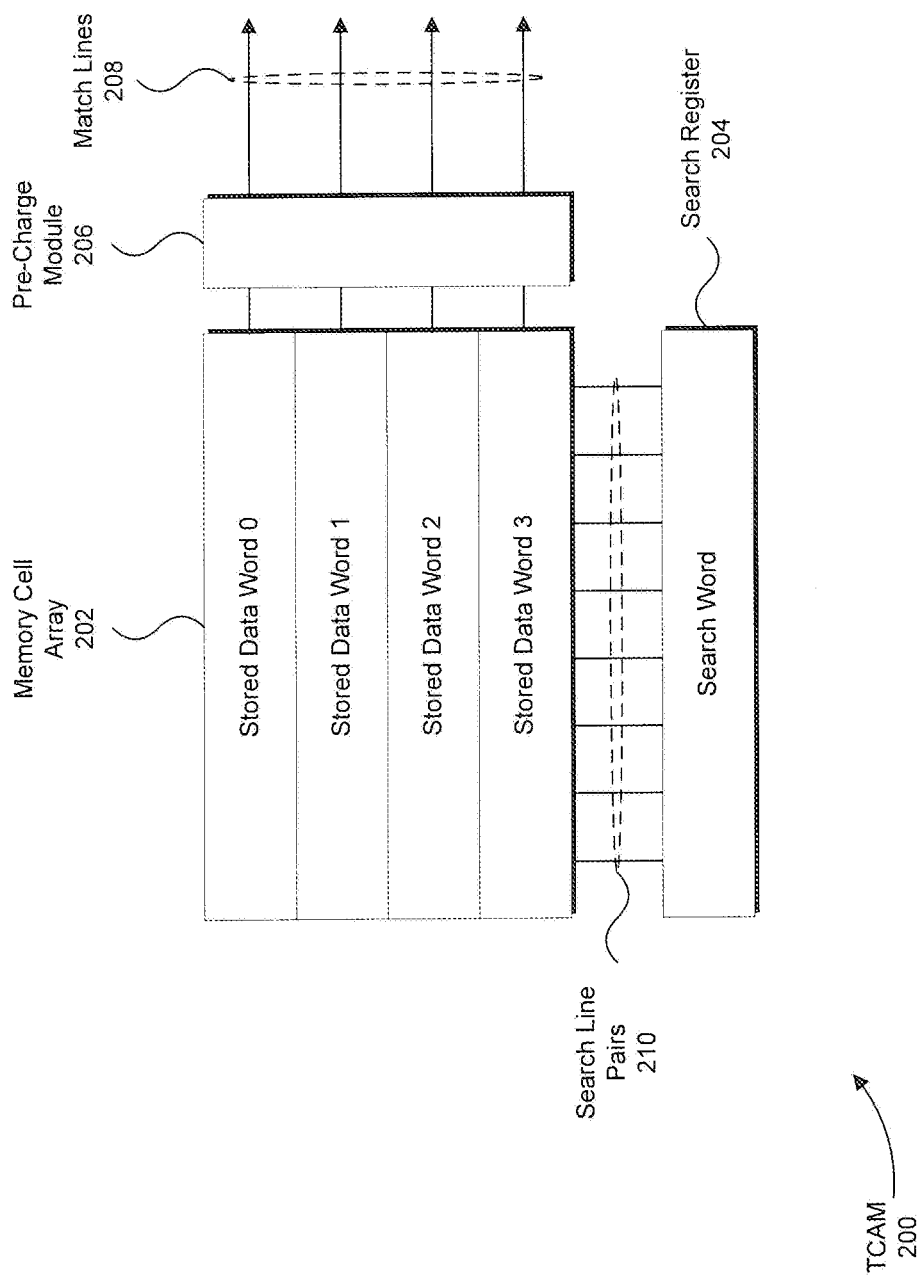
FIG. 2A illustrates a block diagram of a TCAM in accordance with embodiments of the present disclosure.

FIG. 2A illustrates a block diagram of a TCAM 200 in accordance with embodiments of the present disclosure. TCAM 200 includes a memory cell array 202, a search register 204, and a pre-charge module 206. Similar to RAM and other memory types, TCAM 200 can provide the ability to read and write data words to memory cell array 202. However, in addition to this basic functionality, TCAM 200 further supports a search operation for determining the address or location within memory cell array 202 of any stored data words that match a search word loaded into search register 204. This search function is what makes TCAM 200 "content addressable" and separates it from other memory types with the ability only to read and write data to a memory cell array, such as memory cell array 202.

In TCAM 200, individual memory cells (not shown) make up memory cell array 202 and are referred to as ternary memory cells. A ternary memory cell is configured to store two-bits of information that can represent three different logic values: logic zero ('0'), logic one ('1'), and logic don't care ('X'). Logic don't care is a wildcard value that can represent either logic zero or logic one. A row of ternary memory cells in memory cell array 202 represents a stored data word. As shown in FIG. 2A, memory cell array 202 includes four rows that each includes a stored data word, and each of these four rows or data words is associated with a respective one of match lines 208. It will be appreciated by one of ordinary skill in the art that other memory cell array configurations for storing data words, other than on a per row basis, are possible. The per row configuration shown in FIG. 2A is provided for illustration purposes only and is not intended to be limiting.

A search operation begins with loading a search word into search register 204 and pre-charging match lines 208 using pre-charge module 206. Although not shown in FIG. 2A, pre-charge module 206 can include a separate pull-up transistor for pre-charging each match line 208. While pre-charged, match lines 208 are all in a matched state. After the search word is loaded into search register 204 and match lines 208 are all pre-charged, the search word is placed onto search line pairs 210. Each ternary memory cell in a row of memory cell array 202 is coupled to a corresponding different one of search line pairs 210 and compares its stored logic value (i.e., logic zero, logic one, or logic don't care) to the logic value on the search line pair to which it is coupled. If the logic value stored in the ternary memory cell does not match the logic value on the search line pair to which it is coupled, the ternary memory cell discharges the match line associated with its data word. Otherwise, the ternary memory cell does not affect the charged match line associated with its data word. Thus, match lines 208 associated with stored data words with logic values that all match their corresponding logic values in the search word remain pre-charged and in the matched state. Match lines 208 associated with stored data words with at least one logic value that does not match its corresponding logic value in the search word are discharged to ground potential and are placed in an unmatched state.

Upon completion of the search operation, an encoder (not shown) is typically used to map any match line that remains in a matched state to its associated address in memory cell array 202 and provides the address as output. If multiple match lines remain in a matched state, a priority encoder (not shown) can be used to map the match line associated with a best or highest priority matching entry to its associated address in memory cell array 202 and provide the address as output.

Figure 2B:
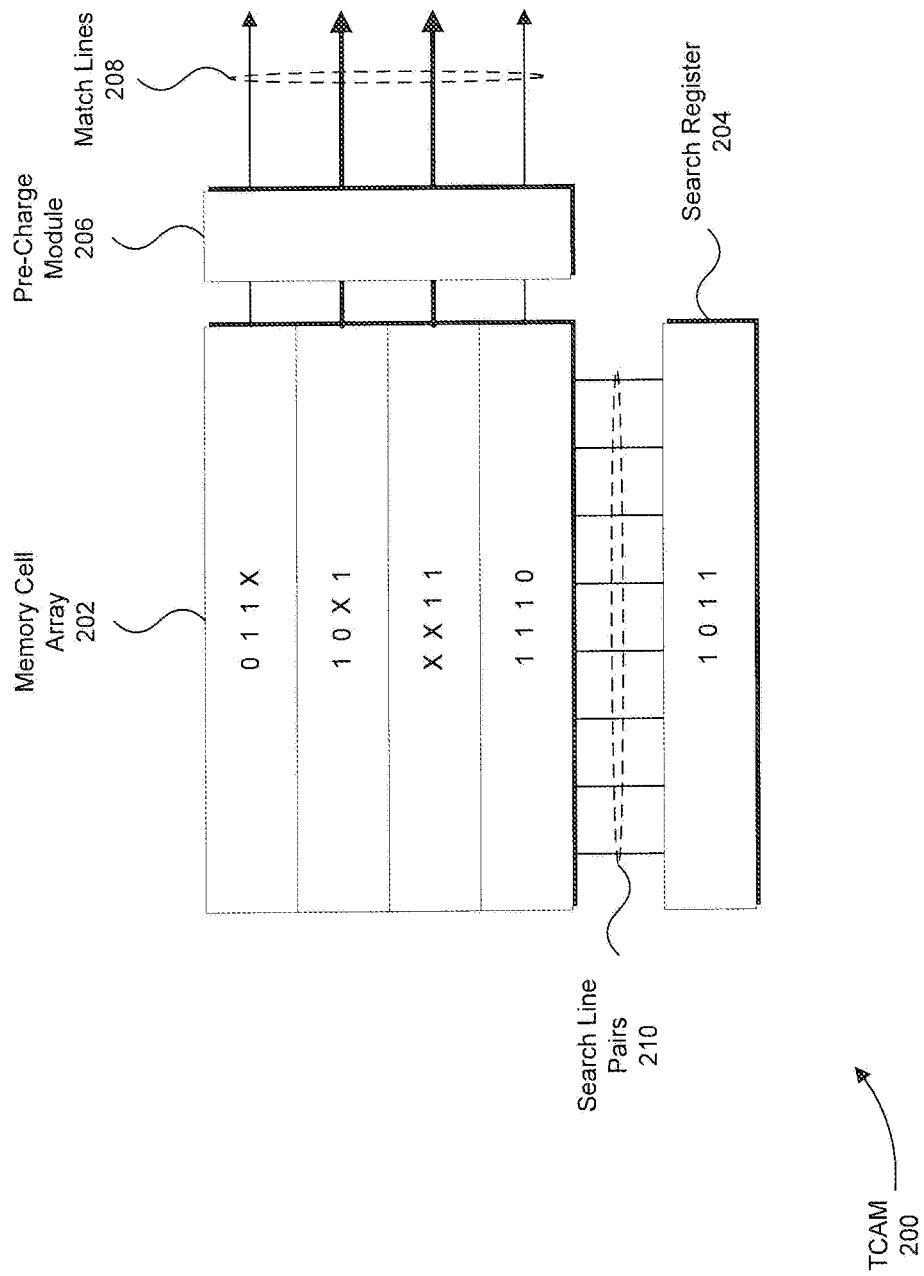
FIG. 2B illustrates a block diagram of a TCAM in the process of an exemplary search operation in accordance with embodiments of the present disclosure.

Referring now to FIG. 2B, TCAM 200 is illustrated in the process of an exemplary search operation in accordance with embodiments of the present disclosure. As shown, TCAM 200 stores the following four data words: '011X', '10X1', 'XX11', and '1110', where '0' corresponds to logic zero, '1' corresponds to logic one, and 'X' corresponds to logic don't care (i.e., a wildcard value that can represent either logic zero or logic one). In the beginning of the search operation, search register 204 is loaded with search word '1011' and match lines 208 are pre-charged using pre-charge module 206. After search register 204 is loaded and match lines 208 are pre-charged, the search word is placed onto search line pairs 210 for comparison to the stored data words. Match lines 208 associated with the data words '011X' and '1110' are discharged because they do not match the search word '1011', whereas match lines 208 associated with the data words '10X1' and 'XX11' remain pre-charged and in a matched state because they match the search word '1011'. It should be noted that, although not shown in FIG. 2B, the search word loaded into search register 204 can also include logic don't care values in embodiments of TCAM 200.

Figure 2C:
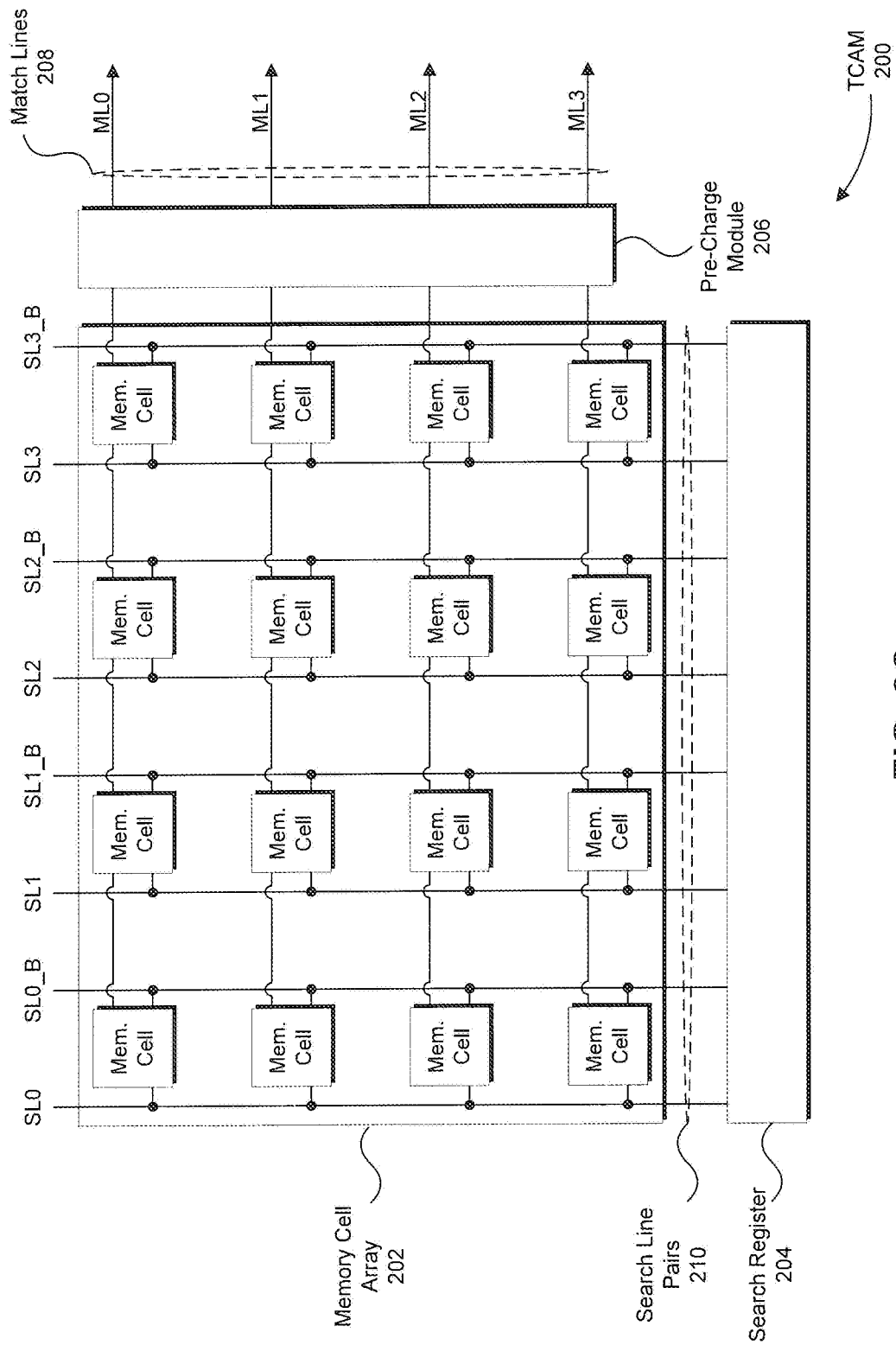
FIG. 2C illustrates a block diagram of a TCAM and details of its associated memory cell array in accordance with embodiments of the present disclosure.

Referring now to FIG. 2C, TCAM 200 is illustrated with further implementation details of memory cell array 202. As shown in FIG. 2C, memory cell array 202 includes 16 ternary memory cells, each denoted by the label "mem cell", with four ternary memory cells per row or per data word. The ternary memory cells can be, for example, NAND or NOR type ternary memory cells. As further shown in FIG. 2C, each ternary memory cell in a row is coupled to a corresponding different one of search line pairs 210. Search line pairs 210 include a first search line pair SL0, SL0_B, a second search line pair SL1, SL1_B, a third search line pair SL2, SL2_B, and a fourth search line pair SL3, SL3_B. Each of these four pairs of search lines is used to provide a different one of the logic values in a search word loaded into search register 204 to the ternary memory cells in memory cell array 202 during a search operation.

In some TCAM devices, many more rows of data words with many more ternary memory cells in each row are typically included in these devices than what is shown in TCAM 200. For example, some TCAM devices can include many thousands or millions of data words, and each data word can use 16, 32, 64, 128 or more ternary memory cells to store its information. Taking these TCAM devices into consideration, it becomes evident that that the current flow associated with charging and discharging the often long match lines associated with each data word during each and every search operation can result in a large amount of power consumption, especially given that the vast majority of match lines are typically discharged during a search operation. Therefore, it is desirable to reduce the number of match lines that are pre-charged unnecessarily before a search operation.

3. PRE-COMPUTATION BASED TCAM

Described below are embodiments of a pre-computation based TCAM configured to reduce the number of match lines being pre-charged during a search operation to save power. The embodiments of the pre computation based TCAM store additional information in a secondary TCAM that is used to determine which match lines in a primary TCAM storing data words to be searched need not be pre-charged because they are associated with data words guaranteed to not match.

The additional information stored in the secondary TCAM can include a pre-computation word that represents a range inclusive of a lower and upper bound of a number of logic ones possible in a corresponding data word stored in the primary TCAM. Using this additional information, the pre-computation based TCAM can, before a search operation is fully conducted, disable pre-charging of a match line associated with the data word if a count of the number of logic ones in the word to be searched (i.e., the search word) does not fall within the range represented by the pre-computation word. This is because, if the count of the number of logic ones in the search word does not fall within the range represented by the pre-computation word, the data word is guaranteed to not match the search word and, therefore, there is no need to pre-charge its associated match line. These and other features of the pre-computation based TCAM are described below in regard to FIGS. 3 and 4.

Figure 3:
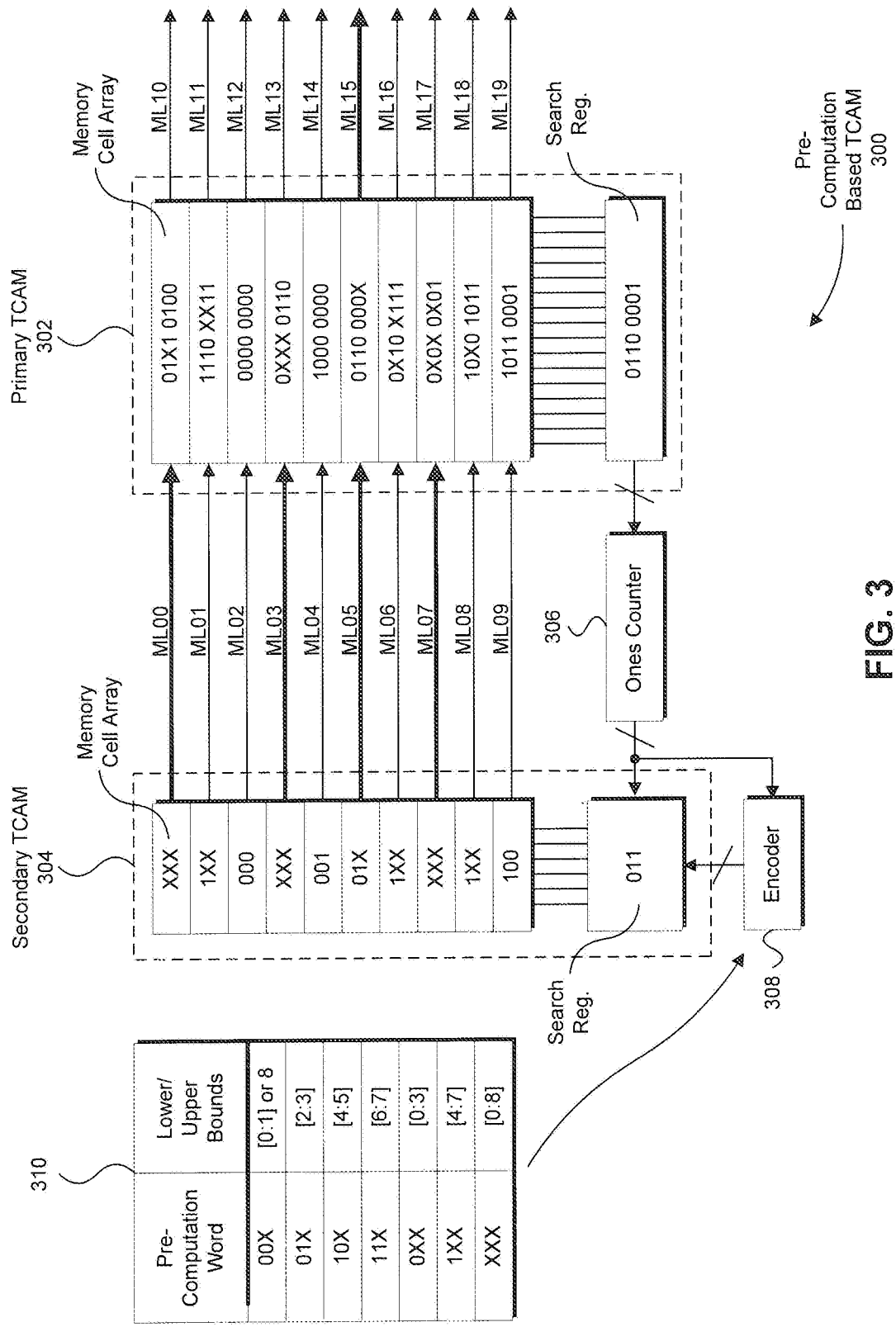
FIG. 3 illustrates a block diagram of a pre-computation based TCAM in accordance with embodiments of the present disclosure.

Referring now to FIG. 3, a pre-computation based TCAM 300 in accordance with embodiments of the present disclosure is illustrated. As shown, pre-computation based TCAM 300 includes a primary TCAM 302, a secondary TCAM 304, a ones counter 306, and an optional encoder 308. Both primary TCAM 302 and secondary TCAM 304 include a memory cell array and a search register, and both can be implemented in a similar manner as TCAM 200 described above in FIGS. 2A-2C. The pre-charge modules of primary TCAM 302 and secondary TCAM 304 have been omitted from FIG. 3 for the sake of clarity.

In the specific example of FIG. 3, the memory cell array of primary TCAM 302 stores ten data words, each in a different row. These ten data words can be searched to determine which, if any, match a search word loaded into the search register of primary TCAM 302. For example, the search register of primary TCAM 302 can be loaded with the search word '01100001' as shown in FIG. 3 to determine which, if any, of the ten data words stored in the memory cell array of primary TCAM 302 have a matching value. Rather than pre-charging all of the ten match lines associated with each data word in primary TCAM 302 to carry out this search operation, as is done in conventional TCAMs, pre-computation based TCAM 300 first performs an initial search of secondary TCAM 304 to determine which, if any, of the match lines associated with the ten data words in primary TCAM 302 need to be pre-charged.

More specifically, as further shown in the specific example of FIG. 3, the memory cell array of secondary TCAM 304 stores ten pre-computation words, each in a different row. These ten pre-computation words each correspond to a different one of the ten data words stored in the memory cell array of primary TCAM 302. The value of each of these ten pre-computation words represents a range inclusive of but not necessarily equal to, a lower and upper bound of a number of logic ones possible in the data word stored in primary TCAM 302 to which it corresponds. For example, the fourth data word stored closest to the bottom in the memory cell array of primary TCAM 302 is '0X10X111'. This data word has a lower bound of possible logic ones equal to four and an upper bound of possible logic ones equal to six, where for the lower bound determination all logic don't cares 'X' are resolved as being logic zeros '0' and for the upper bound determination all logic don't cares 'X' are resolved as being logic ones '1'. This data word corresponds to the fourth pre-computation word stored closest to the bottom in the memory cell array of secondary TCAM 304, which has a stored value of '1XX'. As can be verified, this stored value represents all binary numbers in the range of ['100'-'111'], or all decimal numbers in the range of [4-7], which is inclusive of the decimal range [4-6] of possible logic ones in the data word '0X10X111' to which it corresponds.

The other nine pre-computation words stored in secondary TCAM 304 correspond to similarly positioned data words in primary TCAM 302. Each of these nine pre-computation words has a value that represents a range inclusive of, but not necessarily equal to, a lower and upper bound of a number of logic ones possible in its corresponding data word in primary TCAM 302.

Thus, with the above in mind, when tasked with performing a search operation for a search word loaded into the search register of primary TCAM 302, the number of logic ones in the search word can be counted using ones counter 306 to generate a count value. This count value can then be used to perform an initial search of secondary TCAM 304 to determine which data words in primary TCAM 302, if any, have a potential logic ones count range that includes the count value. The data words in primary TCAM 302 that potentially have a logic ones count range that includes the count value are indicated by pre-computation words stored in secondary TCAM 304 that match the count value.

For the example search operation shown in FIG. 3, ones counter 306 generates a binary count value of '011', or a decimal count value of three, for the search word '01100001' loaded into the search register of primary TCAM 302. After being generated by ones counter 306, this count value can be loaded into the search register of secondary TCAM 304 and an initial search through the pre-computation words stored in secondary TCAM 304 performed. As shown in FIG. 3, the four pre-computation words in secondary TCAM 304 associated with match lines ML00, ML03, ML05, and ML07 match the count value. Thus, based on this initial search, only four of the ten match lines associated with the data words stored in the primary TCAM 302 need be pre-charged to perform the search operation for the search word '01100001'. The match lines associated with these four data words are match lines ML10, ML13, ML15, and ML17. The completed search operation for the search word '01100001' results in a single match to the data word associated with match line ML15 as shown in FIG. 3.

In one embodiment, the match lines of secondary TCAM 304 are used to enable/disable the pre-charging of match lines in primary TCAM 302. For example, a match line of secondary TCAM 304 can be used to gate the control signal used to turn on a pull-up transistor associated with a match line of primary TCAM 302 if the match line of secondary TCAM 304 is not in a matched state. In other embodiments, some other method of enabling/disabling the pre-charging of match lines in primary TCAM 302 based on the match lines of secondary TCAM 304 can be used.

As further shown in FIG. 3, pre-computation based TCAM 300 can optionally include an encoder 308. Encoder 308 can be used to determine pre-computation words to store in secondary TCAM 304 based on data words in the process of being stored, or already stored within, primary TCAM 302. For example, a data word in the process of being stored in primary TCAM 302 can be loaded into the search register of primary TCAM 302 or some other register of primary TCAM 302. Ones counter 306, or potentially some other module, can then be configured to determine the lower and upper bound of the number of logic ones possible in the data word to be stored in primary TCAM 302. These bounds can then be passed to encoder 308, which can encode, or map, the bounds to a pre-computation word. Table 310 provides one potential mapping of lower and upper bounds to pre-computation words that can be used by encoder 308. This mapping provided by table 310 corresponds to a binary mapping. It should be noted that other mappings directed to improving one or more of power, timing, and area of pre-computation based TCAM 300 are possible. Once the mapping is complete, encoder 308 can pass the determined pre-computation word to the search register of secondary TCAM 304 or some other register of secondary TCAM 304 for storing at an appropriate location in secondary TCAM 304.

It should be noted that the use of logic ones in determining counts and ranges to perform the above noted pre-computation functionality has been arbitrarily chosen. In other embodiments of pre-computation based TCAM 300, the use of logic zeros (or even a combination of logic zeros and logic ones) in determining counts and ranges to perform the above noted pre-computation functionality can be used.

Figure 4:
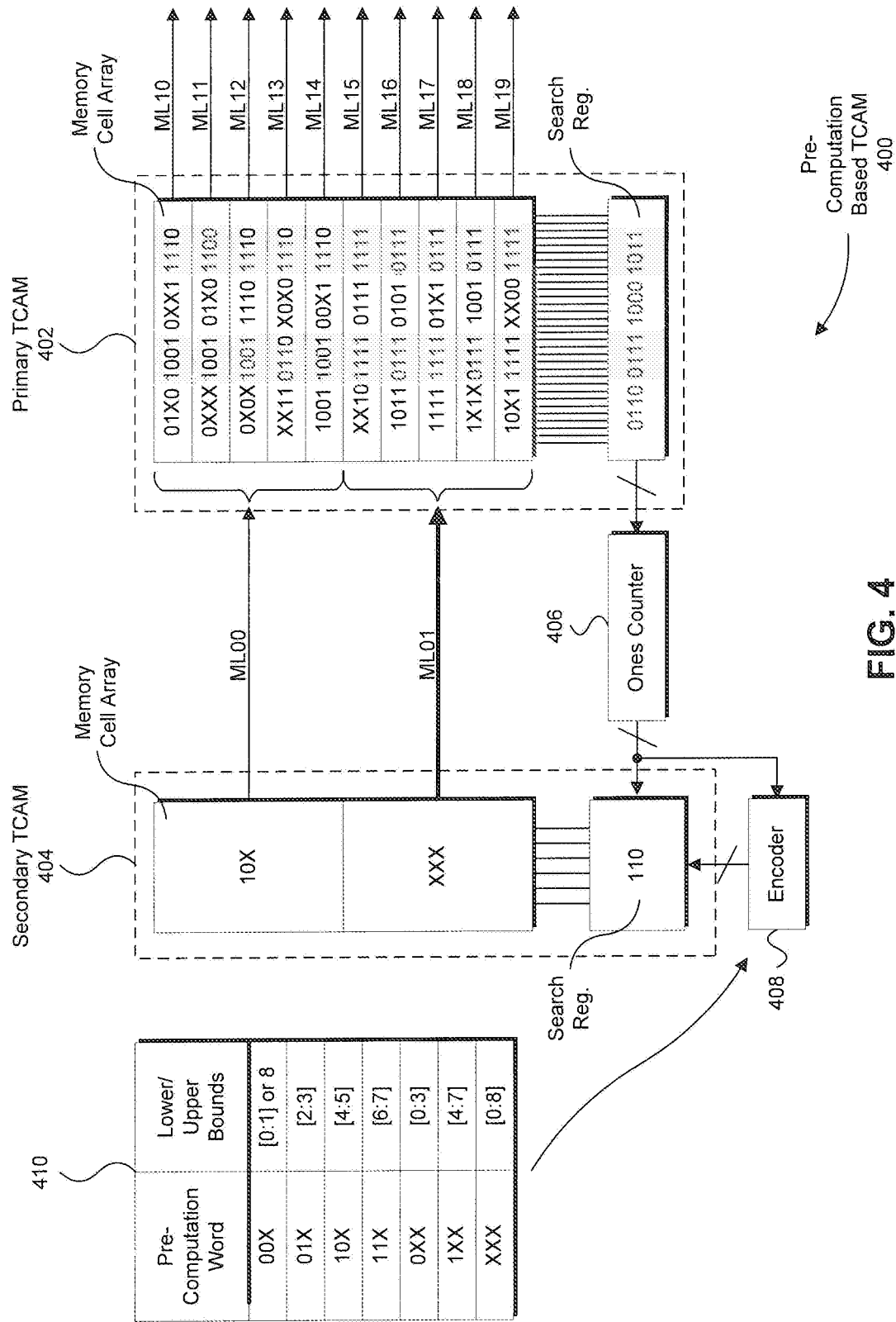
FIG. 4 illustrates a block diagram of a pre-computation based TCAM in accordance with embodiments of the present disclosure.

Referring now to FIG. 4, another pre-computation based TCAM 400 in accordance with embodiments of the present disclosure is illustrated. As shown, pre-computation based TCAM 400 is substantially similar to pre-computation based TCAM 300 illustrated in FIG. 3. However, pre-computation based TCAM 400 stores pre-computation words in secondary TCAM 404 that correspond to only portions of data words, rather than entire data words, stored in primary TCAM 402. More specifically, the value of a pre-computation word stored in secondary TCAM 404 represents a range inclusive of, but not necessarily equal to, a lower and upper bound of a number of logic ones possible in only a portion of a data word stored in the primary TCAM 402 to which it corresponds. In the example shown in FIG. 4, the portions of the data words stored in primary TCAM 402 used to determine the pre-computation words stored in secondary TCAM 404 are shown highlighted in grey. During a search operation, ones counter 406 can be configured to count only the number of logic ones in corresponding portions of a search word. These portions of an exemplary search word loaded into the search register of primary TCAM 402 are similar shown highlighted in grey.

In addition to utilizing only a portion of a data word to determine the value of a corresponding pre-computation word, each pre-computation word stored in secondary TCAM 404 can be further associated with, and its value determined based on, a block of data words, as opposed to a single data word. Thus, in the example shown in FIG. 4, the bottom five data words stored in primary TCAM 402 correspond to the single, bottom most pre-computation word stored in secondary TCAM 404. This pre-computation word has a value that represents a range inclusive of, but not necessarily equal to, a lower and upper bound of a number of logic ones possible in each of the greyed portions of the five data words in primary TCAM 404 to which it corresponds. By associating a pre-computation word in secondary TCAM 404 with a block of data words in primary TCAM 402, not only can area and power requirements of secondary TCAM 404 be reduced (because less pre-computation words need to be stored), but also the search line power associated with primary TCAM 402 can be reduced as will be appreciated by one of ordinary skill in the art.

An example search operation is shown in FIG. 4 that illustrates the above concepts. Again, it should be noted that the use of logic ones in determining counts and ranges to perform the above noted pre-computation functionality has been arbitrarily chosen. In other embodiments of pre-computation based TCAM 400, the use of logic zeros (or even a combination of logic zeros and logic ones) in determining counts and ranges to perform the above noted pre-computation functionality can be used.

4. CONCLUSION

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

What is claimed is:

1. A pre-computation based ternary content addressable memory (TCAM), comprising:
   a primary TCAM comprising a match line associated with a data word in the primary TCAM; and
   a secondary TCAM comprising a match line associated with a pre-computation word in the secondary TCAM,
   wherein the pre-computation word represents a range inclusive of a lower bound of a number of ones or zeros possible in the data word and an upper bound of the number of ones or zeros possible in the data word, and
   wherein the match line associated with the pre-computation word in the secondary TCAM is configured to disable pre-charging of the match line associated with the data word in the primary TCAM.

2. The pre-computation based TCAM of claim 1, further comprising:
   a counter configured to generate a count of a number of ones or zeros in a search word.

3. The pre-computation based TCAM of claim 2, wherein the search word is loaded into a search register included in the primary TCAM.

4. The pre-computation based TCAM of claim 2, wherein the count is loaded into a search register included in the secondary TCAM.

5. The pre-computation based TCAM of claim 2, wherein the match line associated with the pre-computation word in the secondary TCAM is configured to disable pre-charging of the match line associated with the data word in the primary TCAM if the count of the number of ones or zeroes in the search word does not fall within a range represented by the pre-computation word.

6. The pre-computation based TCAM of claim 1, wherein the range represented by the pre-computation word is not equal to a range defined by the lower bound of the number of ones or zeros possible in the data word and the upper bound of the number of ones or zeros possible in the data word.

7. The pre-computation based TCAM of claim 1, wherein the match line associated with the pre-computation word is configured to gate a control signal coupled to a pull-up transistor used to pre-charge the match line associated with the data word.

8. The pre-computation based TCAM of claim 1, further comprising:
    an encoder configured to convert a range defined by the lower bound of the number of ones or zeros possible in the data word and the upper bound of the number of ones or zeros possible in the data word into the pre-computation word.

9. A pre-computation based ternary content addressable memory (TCAM), comprising:
    a primary TCAM comprising a match line associated with a data word in the primary TCAM; and
    a secondary TCAM comprising a match line associated with a pre-computation word in the secondary TCAM,
    wherein the matchline associated with the pre-computation word in the secondary TCAM is configured to disable pre-charging of the match line associated with the data word in the primary TCAM based on a count of a number of ones or zeroes in only a portion of a search word used to search the primary TCAM.

10. The pre-computation based TCAM of claim 9, further comprising:
    a counter configured to generate the count of the number of ones or zeros in the portion of the search word.

11. The pre-computation based TCAM of claim 9, wherein the search word is loaded into a search register included in the primary TCAM.

12. The pre-computation based TCAM of claim 9, wherein the count is loaded into a search register included in the secondary TCAM.

13. The pre-computation based TCAM of claim 9, wherein the match line associated with the pre-computation word in the secondary TCAM is configured to disable pre-charging of the match line associated with the data word in the primary TCAM if the count of the number of ones or zeroes in the portion of the search word does not fall within a range represented by the pre-computation word.

14. The pre-computation based TCAM of claim 9, wherein the pre-computation word represents a range inclusive of a lower bound of the number of ones or zeros possible in the portion of the data word and an upper bound of a number of ones or zeros possible in the portion of the data word.

15. The pre-computation based TCAM of claim 14, wherein the range represented by the pre-computation word is not equal to a range defined by the lower bound of the number of ones or zeros possible in the portion of the data word and the upper bound of the number of ones or zeros possible in the portion of the data word.

16. A method for performing pre-computation in a ternary content addressable memory (TCAM), the method comprising:
    storing a data word in a primary TCAM;
    storing a pre-computation word in a secondary TCAM; and
    disabling pre-charging of a match line associated with the data word if a count of a number of ones or zeroes in at least a portion of a search word does not fall within a range represented by the pre-computation word.

17. The method of claim 16, further comprising:
    searching for stored data words in the primary TCAM that match the search word.

18. The method of claim 16, further comprising:
    loading the search word into a search register included in the primary TCAM.

19. The method of claim 16, further comprising:
    loading the count into a search register included in the secondary TCAM.

20. The method of claim 16, wherein the pre-computation word represents a range inclusive of a lower bound of the number of ones or zeros possible in at least a portion of the data word and an upper bound of the number of ones or zeros possible in the at least a portion of the data word.

\* \* \* \* \*